(12) United States Patent
Shinjo et al.

(10) Patent No.: US 9,502,295 B2
(45) Date of Patent: Nov. 22, 2016

(54) PROTECTIVE FILM MATERIAL FOR LASER PROCESSING AND WAFER PROCESSING METHOD USING THE PROTECTIVE FILM MATERIAL

(71) Applicant: NIKKA SEIKO CO., LTD., Setagaya-ku, Tokyo (JP)

(72) Inventors: Masaaki Shinjo, Tokyo (JP); Yoshimasa Takeuchi, Tokyo (JP); Tsuyoshi Tadano, Tokyo (JP); Masafumi Hirose, Tokyo (JP)

(73) Assignee: NIKKA SEIKO CO., LTD. (JP)

( * ) Notice: Subject to any disclaimer, the term of this patent is extended or adjusted under 35 U.S.C. 154(b) by 0 days.

(21) Appl. No.: 14/569,815

(22) Filed: Dec. 15, 2014

(65) Prior Publication Data
US 2015/0179538 A1      Jun. 25, 2015

(30) Foreign Application Priority Data

Dec. 20, 2013  (JP) ................................. 2013-264208
Jun. 19, 2014  (JP) ................................. 2014-125969

(51) Int. Cl.
   *H01L 21/78*   (2006.01)
   *H01L 23/29*   (2006.01)
   *B23K 26/00*   (2014.01)

(52) U.S. Cl.
   CPC ............. *H01L 21/78* (2013.01); *B23K 26/009* (2013.01); *B23K 26/364* (2015.10); *B23K 2201/40* (2013.01); *B23K 2203/56* (2015.10); *H01L 2924/0002* (2013.01)

(58) Field of Classification Search
   CPC ... H01L 23/293; H01L 23/562; H01L 21/78; H01L 2924/0002; B23K 26/009; B23K 26/364; B23K 2201/40; B23K 2203/40
   USPC ........... 257/797; 438/463; 252/589; 524/555
   See application file for complete search history.

(56) References Cited

U.S. PATENT DOCUMENTS

| 6,444,391 | B2* | 9/2002 | Watanabe | ............. | G03F 7/0125 |
|           |     |        |          |              | 430/167 |
| 2010/0221893 | A1* | 9/2010 | Harris | ..................... | H01L 21/78 |
|           |     |        |          |              | 438/462 |

FOREIGN PATENT DOCUMENTS

JP           2007 73670           3/2007

* cited by examiner

*Primary Examiner* — Selim Ahmed
(74) *Attorney, Agent, or Firm* — Adams & Wilks

(57) ABSTRACT

A protective film material for protecting a surface of a wafer during a laser processing treatment contains a water soluble poly-N-vinyl acetamide. The protective film material is applied to the surface of the wafer which is then irradiated with a laser beam through the protective film material to perform a laser processing treatment. After the laser processing treatment, the protective film material is removed by washing with water.

21 Claims, 3 Drawing Sheets

PROTECTIVE FILM MATERIAL FOR LASER PROCESSING AND WAFER PROCESSING METHOD USING THE PROTECTIVE FILM MATERIAL

BACKGROUND OF THE INVENTION

Field of the Invention

The present invention relates to a protective film material that is coated on a surface of a wafer to provide protection when the wafer is irradiated with a laser beam to carry out a processing operation such as scribing, dicing or grooving. The present invention also relates to a wafer processing method using the protective film material.

Background Information

Circuit devices, such as IC, LSI and LED devices, are formed on a surface of a wafer made of a compound such as silicon or sapphire. The surface of the wafer is partitioned by division lines, called streets, provided lengthwise and widthwise on the wafer surface. Respective regions of the wafer surface partitioned by the streets define the circuit devices which are separated into individual circuit devices by cutting the wafer along the streets. Prior to the separation process, the wafer is subjected to laser processing during which the streets are irradiated with a laser beam to form processing grooves, after which the circuit device are separated along the grooves.

When the wafer is subjected to laser processing as described above, wafer forming components (e.g., atoms) vaporized (sublimed) due to laser exposure scatter, and diffuse and fall on the surface of the wafer as foreign matter (debris) and adhere to the wafer surface, including the circuit devices. However, the debris adhered to the surface of the wafer cannot be removed by a subsequent process, such as a water rinse process. As a result, the debris can impact the yield and reliability of the circuit devices formed on the wafer.

As a countermeasure to overcome the foregoing drawbacks of the prior art, in order to control the surroundings during laser processing to avoid the wafer from being influenced by the debris resulting from the scattering of the wafer vaporized (sublimed) components, processing methods such as spraying of gas, vacuum suction, or processing under reduced pressure have conventionally been utilized. However, since such conventional processing methods require the installation and operation of apparatuses and general working conditions which are complex and time consuming, further improvement has been demanded.

Under such circumstances, to solve the foregoing problem caused by debris, a method has been employed in which a protective film comprising a resin is formed on a surface of a wafer to be processed, and the wafer surface is irradiated with a laser beam through the protective film. By this processing method, even if the debris is scattered, the wafer surface can be protected by the protective film and the debris does not attach to the circuit devices.

As the resin forming the protective film, JP-A-2007-073670 proposes the use of polyvinyl alcohol (PVA) that is coated on the wafer surface for protection using a spin coater, for example. After laser processing is carried out, the debris on the PVA coating is washed away simultaneously with the washing of the protective film with water.

While PVA is conveniently used because it can be easily removed by washing with water as described above, however, it is still impossible to prevent the deposition of debris completely. Even after the removal of PVA by washing after the laser processing, a part of the debris attaches to the wafer surface, particularly in the portion adjacent to processed grooves, and cannot be completely removed. Further, as described below, the wafer surface may sometimes have stain-like residues which are considered attributable to thermal change of PVA due to attachment of debris under heated conditions. As a result of the foregoing problems, sufficient protection of the wafer surface cannot be achieved.

SUMMARY OF THE INVENTION

It is an object of the present invention to provide a protective film material for laser processing which is coated on a surface of a wafer to be processed and by which the surface of the wafer can be more securely protected during a laser processing operation, and which can be removed by washing with water after completion of the laser processing operation, to thereby obtain a clear wafer surface without debris being attached to the wafer surface.

The protective film material for laser processing according to the present invention contains poly-N-vinyl acetamide as a water-soluble adhesive for coating the wafer surface for protection during a laser processing operation.

In one exemplary embodiment, the protective film material for laser processing further contains an absorbent which is capable of absorbing mainly a laser beam of ultraviolet ray having a wavelength of 355 nm, a visible ray having a wavelength of 532 nm, an infrared ray having a wavelength of 790 nm, or other desired wavelength, to further effectively conduct laser processing.

According to another aspect of the present invention, there is provided a processing method for a wafer, comprising coating a surface of the wafer, which is to be processed, with a protective film material for laser processing, an irradiating the surface of the wafer, which is to be processed, with a laser beam through the protective film material to perform processing. In one embodiment, the protective film material for laser processing contains poly-N-vinyl acetamide as a water-soluble adhesive. In another embodiment, the protective film material for laser processing further contains an absorbent which is capable of absorbing the laser beam irradiation.

In the processing method according to the present invention, after completion of the laser processing operation the water-soluble protective film material is removed, along with any scattered debri, by washing with water, thereby obtaining a wafer surface clear of any debris, i.e., without debris being attached to the surface of the wafer.

According to the present invention, laser processing such as scribing, dicing or grooving can be conducted under such conditions that the wafer surface is coated and protected with a protective film material. The debris formed by the laser processing can be easily removed by washing with water together with the protective film material. Further, it is possible to obtain a clear-surfaced wafer without formation of stain-like residues that are considered to be caused by the protective film material. By doing so, uniform processing of the wafer can be achieved along streets of narrow width, and the circuit devices can be produced with high efficiency.

Furthermore, the protective film material for laser processing according to the present invention has wide applications in connection with various laser processing treatment operations for which reattachment of the debris formed is anticipated. The protective film material for laser processing according to the present invention can also be used for a grooving step by laser grooving of an insulating film, such as a low dielectric constant (Low-k) film.

Furthermore, as a water-soluble protective film which can be easily removed by washing with water, the protective film material has wide applications for use in preventing scratches on surfaces of materials and suppressing adherence of an adhesive tape, for example, as well as applications in which the required thermal resistance is about 200° C.

BRIEF DESCRIPTION OF THE DRAWINGS

The foregoing summary, as well as the following detailed description of the preferred embodiments of the invention, will be better understood when read in conjunction with the accompanying drawings. For the purpose of illustrating the invention, there is shown in the drawings embodiments which are presently preferred. It should be understood, however, that the invention is not limited to the precise arrangement and instrumentalities shown. In the drawings:

FIG. 1A is a plan view showing the conditions of a groove-processed portion on an enlarged scale, and FIG. 1B is an end view showing the conditions of the groove-processed portion on an enlarged scale;

FIG. 2A is a plan view showing the conditions of a groove-processed portion on an enlarged scale, and FIG. 2B is an end view showing the conditions of the groove-processed portion on an enlarged scale;

DETAILED DESCRIPTION OF THE PREFERRED EMBODIMENTS

The word "exemplary" is used herein to mean "serving as an example, instance, or illustration." Any embodiment described herein as "exemplary" is not necessarily to be construed as preferred or advantageous over other embodiments. It is to be understood that the terminology used herein is for purposes of describing particular embodiments only, and is not intended to be limiting.

Figure 1A:
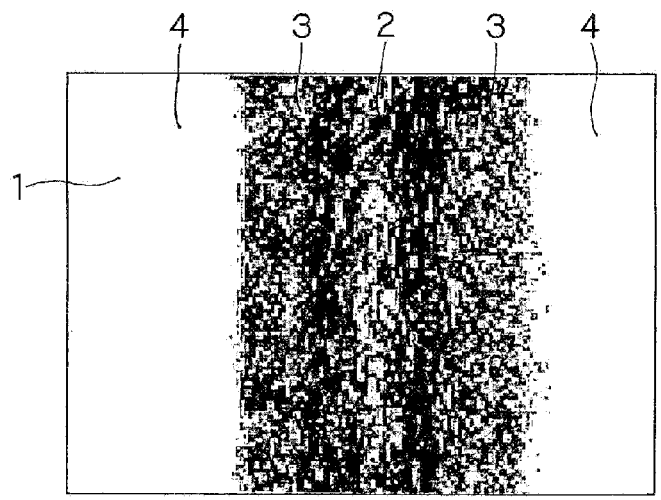
FIGS. 1A and 1B show test results of an example of the present invention, where
Figure 1B:
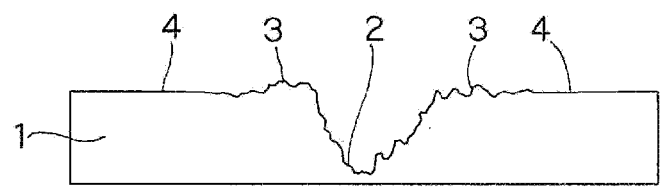
Figure 2A:
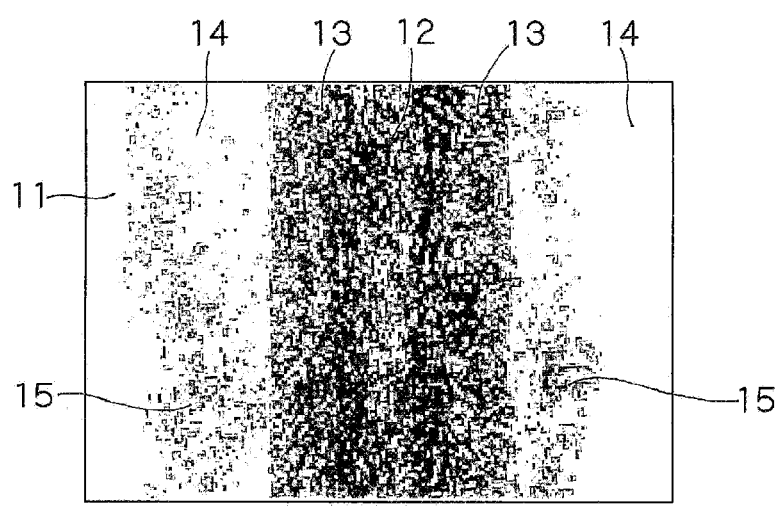
FIGS. 2A and 2B show test results of a comparative example, where
Figure 2B:
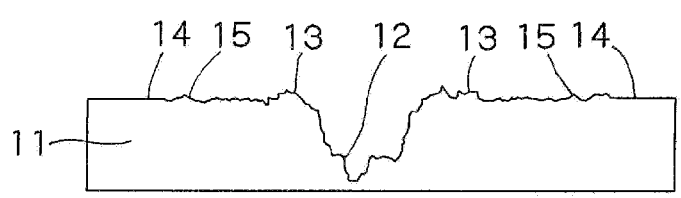

FIGS. 1A and 1B show test results of an example of the present invention, and FIGS. 2A and 2B show test results of a comparative example. The test results shown in FIGS. 1A-1B and 2A-2B correspond to Example 1 and Comparative Example 1, respectively, as further described below.

Figure 3A:
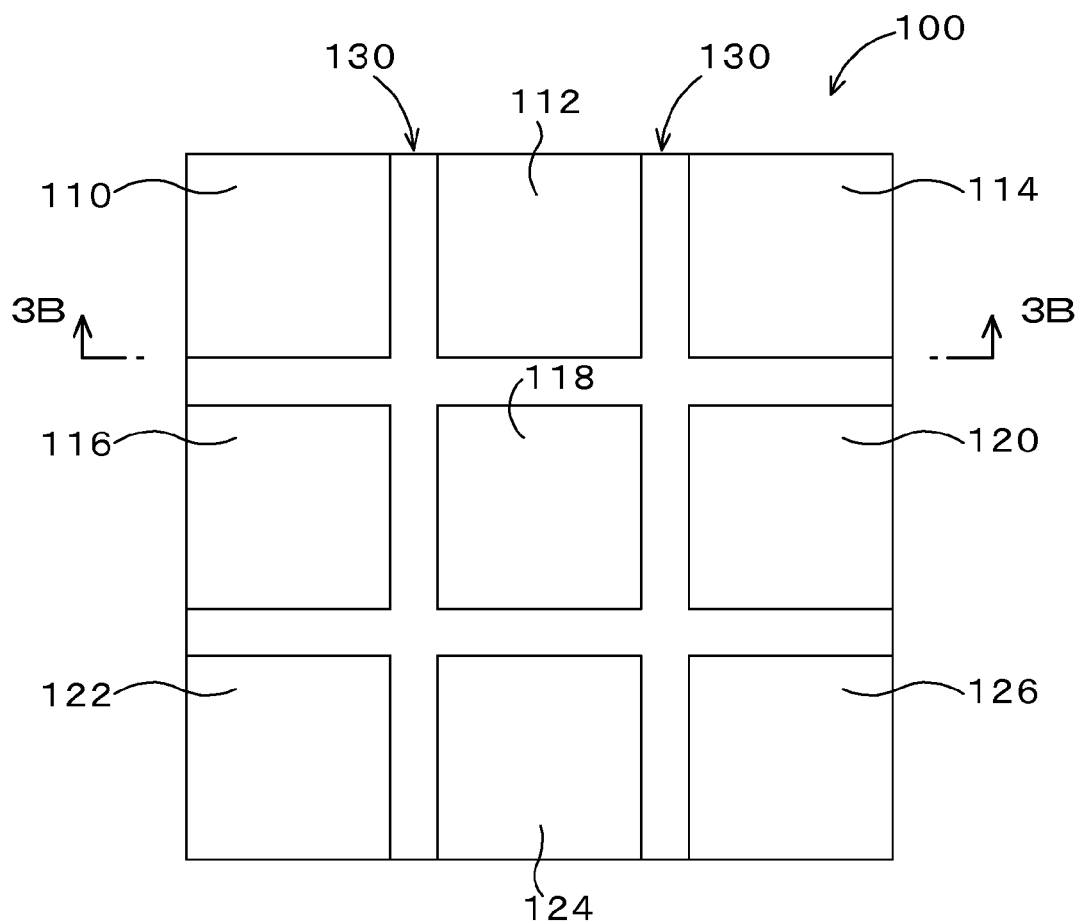
FIG. 3A shows a top plan view of a portion of a wafer having a number of discrete circuit structures formed on a surface of the wafer separated by streets.
Figure 3B:
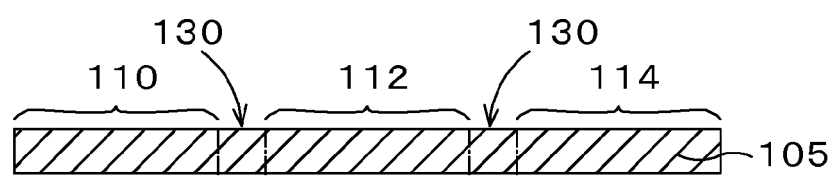
FIG. 3B shows a cross-sectional side portion of the structure of FIG. 3A through line 3B-3B.

FIG. 3A is a schematic plan side view of a portion of a substrate such as a wafer with a number of discrete circuit structures formed therein and thereon. FIG. 3B is a cross-sectional side view of the structure of FIG. 3A through line 3B-3B. Referring to FIGS. 3A and 3B, structure 100 includes a substrate 105 of, for example, a semiconductor material such as silicon or a semiconductor layer on an insulator such as glass. Structure 100 is a portion of a structure at a wafer level with a number of circuit structures (dies or chips) 110, 112, 114, 116, 118, 120, 122, 124 and 126 formed on a surface of the wafer. Each circuit structure is separated on the wafer by streets 130 that are used to separate the circuit structures from the substrate into a discrete die or chip. Each circuit structure may have a number of circuit devices (e.g., IC, LSI and/or LED) formed in and on the surface of the wafer and one or more interconnection layers (not shown) formed above the wafer and connecting with the devices on a respective die or chip.

Figure 3C:
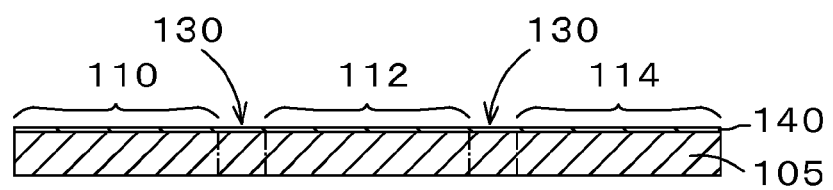
FIG. 3C shows the structure of FIG. 3B following the application on the surface of the wafer of a protective film material for laser processing according to the present invention.

FIG. 3C shows the structure of FIG. 3B following the application on the surface of the wafer of a protective film material 140 for laser processing according to the present invention. Protective film material 140 for laser processing, as viewed, overlies each circuit structure of the structure 100 as well as the scribe streets 130.

According to the present invention, the protective film material 140 for laser processing comprises poly-N-vinyl acetamide as a water-soluble adhesive. As the poly-N-vinyl acetamide, a homopolymer of N-vinyl acetamide is preferred. Furthermore, the poly-N-vinyl acetamide has a decomposition kick-off temperature of about 360° C. and has good heat resistance.

The weight average molecular weight of the poly-N-vinyl acetamide is about 5,000 to 2,000,000, preferably about 10,000 to 1,730,000, and more preferably about 20,000 to 1,000,000.

The concentration of poly-N-vinyl acetamide used is in the range of about 0.1 to 40 mass %. Preferably, the concentration of the poly-N-vinyl acetamide is about 1 to 20 mass %, more preferably about 1.5 to 8 mass %, and further preferably about 1.5 to 5 mass %.

The poly-N-vinyl acetamide is water-soluble, and pure water is used as a solvent for it. Furthermore, together with pure water, one type or plural types of an alcohol such as isopropyl alcohol, a glycerol, and a glycol ether, for example, may be blended.

The protective film material 140 for laser processing can be applied (coated) to the surface of the wafer using a spin coater or a spraying device, for example, in order to obtain an even coating surface. Furthermore, the application of the protective film material for laser processing can be achieved without requiring any particular baking operation.

As the laser beam for performing the laser processing, although various types may be used, an ultraviolet ray having a wavelength of 355 nm, visible light having a wavelength of 532 nm, and an infrared ray having a wavelength of 790 nm, for example, are preferred.

In one exemplary embodiment, the protective film material 140 for laser processing further contains an absorbent for absorbing a desired wavelength or wavelengths of the laser beam. By this construction, laser processing can be efficiently conducted.

For absorption of the ultraviolet ray, the absorbent used is preferably one of a triadine type, a benzophenone type, a benzotriazole type, an anthraquinone type, and a distyrylbiphenyl derivative, for example. For absorption of an infrared ray, the absorbent used is preferably one of 1,1,5,5-tetrakis [4-(diethylamino)phenyl]-1,4-pentadiene-3-ylium, and p-toluenesulfonate, for example. Alternatively, any other known absorbent for laser beams, such as colorants and dyes having a laser beam absorptivity, may be selected as the absorbent for the protective film material.

As described above, the protective film material 140 for laser processing is applied on the surface of the wafer by spin coating or spraying, for example. In accordance with another exemplary embodiment, in order to prevent repelling of the protective film material from the wafer surface during application of the protective film material, a surfactant is preferably added to the protective film material in order to increase its wetting ability and coating properties, thereby increasing the storage stability of its solution. As the surfactant, nonionic, cationic, anionic or amphoteric surfactants, for example, may be used so long as the surfactant selected is water-soluble.

For example, the nonionic surfactant may be one of a a nonylphenol type, a higher alcohol type, a polyhydric alcohol type, a polyoxyalkylene glycol type, a polyoxyethylene alkylester type, a polyoxyethylene alkylether type, a polyoxyethylene alkylphenolether type and a polyoxyethylene sorbitan alkylester type. The cationic surfactant may be, for example, a quaternary ammonium salt or an amine salt. The anionic surfactant may be one of alkylbenzene sulfonic acid or its salt, alkylsulfuric acid ester salt, methyl taurine salt, and ether sulfonate, for example. The amphoteric surfactant may be one of an imidazolinium betaine type, an amidopropyl betaine type, and a salt of an aminodipropionate type, for example.

One type or two or more types of the foregoing surfactants may appropriately be selected for inclusion in the protective film material. Preferably, the surfactant(s) are used in an amount of 0.05 mass % to 5 mass % as an effective component on the basis of the total amount of the protective film material.

In further alternative embodiments, a preservative such as phenyl glycol may be added to the protective film material, if necessary, in order to increase its storage stability. Moreover, a plasticizer and/or an organic acid, for example, may be used as required.

Figure 4:
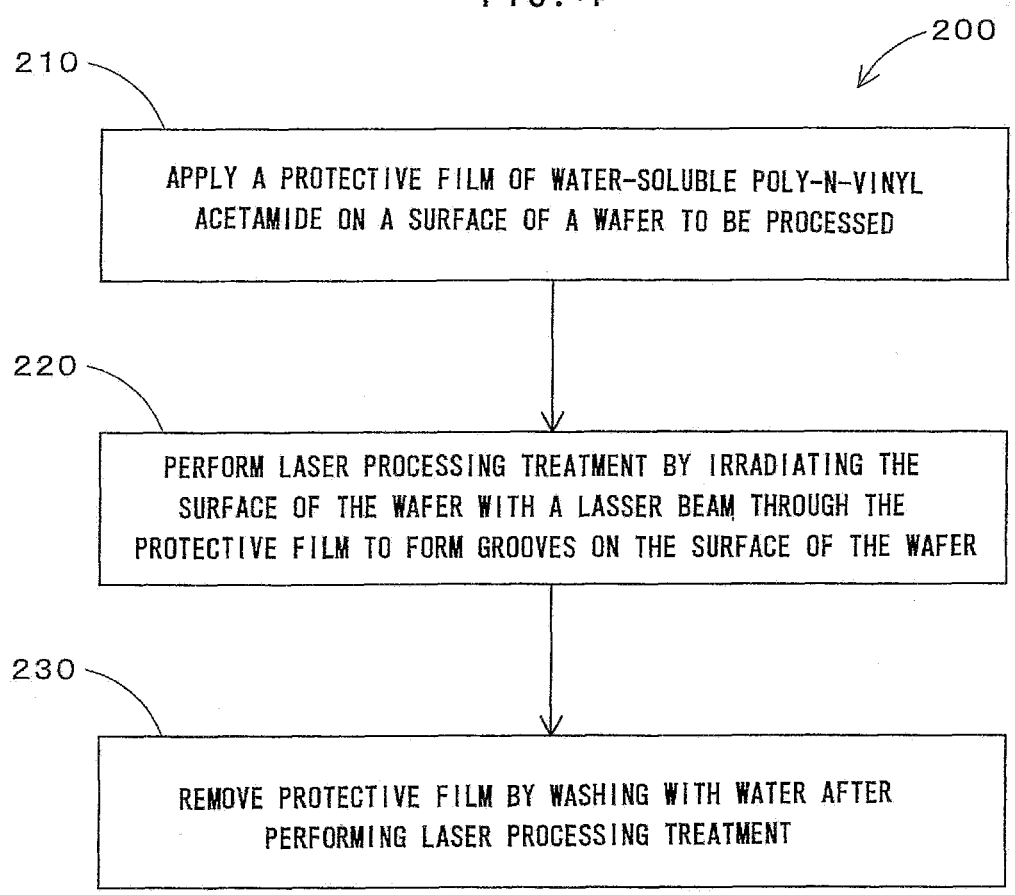
FIG. 4 is a process flowchart illustrating a wafer processing method according to the present invention.

FIG. 4 is a process flowchart illustrating an exemplary embodiment of a wafer processing method 200 using the protective film material according to the present invention. The protective film material according to the present invention is applied (e.g., by spin coating or spraying) to the surface of the wafer to be processed (Step 210), as denoted for example by the protective film material 140 shown in FIG. 3C. This is followed by a laser processing treatment (Step 220) in which the surface of the wafer (including the scribe streets 130 in FIGS. 3A-3C) are irradiated with a laser beam through the protective film material to form grooves on the surface of the wafer along the scribe streets.

After conducting the laser processing treatment using the protective film material according to the present invention as described above, the water-soluble protective film material is removed, along with any scattered debris, by washing with water, thereby obtaining a clear wafer surface without debris being attached thereto (Step 230). Further washing may then be conducted using a brush or by applying ultrasonic waves. Thus, by the protective film material and wafer processing method according to the present invention, the protective film material can be efficiently removed together with debris generated by the laser processing treatment.

EXAMPLES

Example 1

A protective film material for laser processing was obtained by thoroughly mixing 20 mass % of a mixture containing 12.5 mass % of poly-N-vinyl acetamide (PN-VAGE-191-104 manufactured by Showa Denko K.K.; weight average molecular weight: 500,000) and 87.5 mass % of pure water; 0.96 mass % of N-palm oil fatty acid acyl-L-glutamic acid triethanolamine as a surfactant; 0.1 mass % of ethylene glycol monophenyl ether as a preservative; and 78.94 mass % of pure water. The content of poly-N-vinyl acetamide was 2.5 mass %.

Example 2

A protective film material for laser processing was obtained by thoroughly mixing 28 mass % of a mixture containing 12.5 mass % of poly-N-vinyl acetamide (the same as above) and 87.5 mass % of pure water; 0.8 mass % of a triazine type ultraviolet ray absorber capable of absorbing a laser beam having a wavelength of 355 nm; 0.16 mass % of N-palm oil fatty acid acyl-L-glutamic acid triethanolamine as a surfactant; 1 mass % of ethylene glycol monophenyl ether as a preservative; and 70.04 mass % of pure water. The content of poly-N-vinyl acetamide was 3.5 mass %.

Example 3

A protective film material for laser processing was obtained by thoroughly mixing 11 mass % of a mixture containing 12.5 mass % of poly-N-vinyl acetamide (the same as above) and 87.5 mass % of pure water; 0.16 mass % of N-palm oil fatty acid acyl-L-glutamic acid triethanolamine as a surfactant; 0.1 mass % of ethylene glycol monophenyl ether as a preservative; and 88.74 mass % of pure water. The content of poly-N-vinyl acetamide was 1.375 mass %.

Example 4

A protective film material for laser processing was obtained by thoroughly mixing 80 mass % of a mixture containing 10 mass % of poly-N-vinyl acetamide (PN-VAGE-191-107 manufactured by Showa Denko K.K.; weight average molecular weight: 31,000) and 90 mass % of pure water; 1.6 mass % of N-palm oil fatty acid acyl-L-glutamic acid triethanolamine as a surfactant; 1 mass % of ethylene glycol monophenyl ether as a preservative; 14 mass % of propylene glycol monomethyl ether as a solvent; and 3.4 mass % of pure water. The content of poly-N-vinyl acetamide was 8 mass %.

Comparative Example 1

A protective film material was obtained by thoroughly mixing 9.3 mass % of polyvinyl alcohol; 0.96 mass % of N-palm oil fatty acid acyl-L-glutamic acid triethanolamine as a surfactant; 1 mass % of ethylene glycol monophenyl ether as a preservative; 10.2 mass % of glycerol as a plasticizer; 15 mass % of propylene glycol monomethyl ether as a solvent; and 63.54 mass % of pure water.

Test

Testing Method

Each of the protective film materials of Example 1 and Comparative Example 1 was applied to the surface of a silicon wafer using a spin coater, and subjected to a groove processing treatment with laser beam having a wavelength of 355 nm. After completion of the processing treatment, the protective film material for laser processing was removed by spraying water as a rinsing liquid thereon in combination with brushing.

After the above treatment, the groove-processed portions formed by the laser processing in Example 1 and Comparative Example 1 were observed at a magnification of 100 times for comparison.

Results

FIG. 1 shows the results of the test for Example 1 described above. FIG. 1A is a plan view showing the conditions of the groove-processed portion on an enlarged scale, and FIG. 1B is an end view likewise showing the conditions of the groove-processed portion on an enlarged scale.

FIG. 2 shows the results of the test for Comparative Example 1 described above. FIG. 2A is a plan view showing the conditions of the groove-processed portion on an enlarged scale, and FIG. 2B is an end view likewise showing the conditions of the groove-processed portion on an enlarged scale.

Comments

In the wafer 1 of Example 1, as shown in FIG. 1A and FIG. 1B, low bank-like portions 3 were formed on both sides of V-shaped grooves 2 formed by the laser processing. However, on the surface 4 of the wafer outside the bank-like portions 3, no attachment of debris and no stain-like protective film material residues were observed.

On the other hand, on the wafer 11 of Comparative Example 1, as shown in FIG. 2A and FIG. 2B, low bank-like portions 13 were formed on both sides of V-shaped grooves 12 formed by the laser processing. On the surface 14 of the wafer in the vicinity of the outside of the bank-like portions 13, the attachment of debris 15 and brown stain-like residues that were not removed by washing were observed. It has been known that if PVA is heated, dehydration starts over 150° C. and at around 220° C. dehydrocondensation starts to produce a polyene. From this fact, it is considered that due to the generation of heat resulting from the attachment of highly heated debris formed by the laser processing, the colorless protective film changed its color into brown, underwent thermal change in nature from water-soluble to water-insoluble, and still attached to the wafer surface.

From the foregoing description of Example 1 in accordance with the protective film material and wafer processing method according to the present invention, it is readily appreciated and understood that the wafer surface can be securely protected, and after the laser processing, debris can be effectively removed together with the protection film material, and a wafer with a clear surface can be obtained.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A protective film material for laser processing, in combination with a wafer having a surface provided with a plurality of circuit devices separated by scribe streets, the protective film material comprising a poly-N-vinyl acetamide as a water-soluble adhesive coated on the surface of the wafer to protect the circuit devices during irradiation of the surface of the wafer with a laser beam through the protective film to separate the wafer into individual circuit devices along the scribe streets.

2. The protective film material for laser processing according to claim 1, wherein the poly-N-vinyl acetamide has a weight average molecular weight of 5,000 to 2,000,000.

3. The protective film material for laser processing according to claim 1, wherein the poly-N-vinyl acetamide is contained at a concentration of 0.1 to 40 mass %.

4. The protective film material for laser processing according to claim 1, wherein the poly-N-vinyl acetamide has a weight average molecular weight of 5,000 to 2,000,000 and is contained at a concentration of 0.1 to 40 mass %.

5. The protective film material for laser processing according to claim 1, further comprising an absorbent capable of absorbing a desired wavelength of the laser beam used for processing.

6. The protective film material for laser processing according to claim 5, wherein the poly-N-vinyl acetamide has a weight average molecular weight of 5,000 to 2,000,000.

7. The protective film material for laser processing according to claim 5, wherein the absorbent comprises a colorant or a dye.

8. The protective film material for laser processing according to claim 1, further comprising an absorbent capable of absorbing a desired wavelength of the laser beam used for processing; wherein the poly-N-vinyl acetamide has a weight average molecular weight of 5,000 to 2,000,000 and is contained at a concentration of 0.1 to 40 mass %.

9. The protective film material for laser processing according to claim 8, wherein the absorbent comprises a colorant or a dye.

10. The protective film material according to claim 1, wherein the protective film material is readily removable by water from the surface of the wafer after irradiation of the surface of the wafer with the laser beam.

11. The protective film material according to claim 10, wherein the poly-N-vinyl acetamide has a weight average molecular weight of 5,000 to 2,000,000.

12. The protective film material according to claim 10, wherein the poly-N-vinyl acetamide is contained at a concentration of 0.1 to 40 mass %.

13. The protective film material according to claim 10, further comprising an absorbent capable of absorbing a desired wavelength of the laser beam applied to the surface of the wafer during irradiation of the surface of the wafer with the laser beam.

14. A protective film for a laser processing treatment, in combination with a f the wafer having a surface provided with a plurality of circuit devices separated by scribe streets, the protective film comprising a film of a water soluble poly-N-vinyl acetamide existing on the surface of the wafer during the laser processing treatment and being readily removable by water from the surface of the wafer, including the circuit devices, after the laser processing treatment.

15. The protective film according to claim 14, wherein the poly-N-vinyl acetamide has a weight average molecular weight of 5,000 to 2,000,000.

16. The protective film according to claim 14, wherein the poly-N-vinyl acetamide is contained at a concentration of 0.1 to 40 mass %.

17. The protective film according to claim 14, further comprising an absorbent capable of absorbing a desired wavelength of the laser beam applied to the surface of the wafer during the laser processing treatment.

18. A method of processing a wafer having a surface provided with a plurality of circuit devices separated by scribe streets, comprising:
   coating the surface of the wafer with a protective film of a water soluble poly-N-vinyl acetamide; and
   irradiating the surface of the wafer with a laser beam through the protective film to separate the wafer into individual circuit devices along the scribe streets.

19. The processing method according to claim 18, wherein a wavelength of the laser beam is 355 nm.

20. The processing method according to claim 18, wherein the irradiation with the laser beam comprises irradiating the surface of the wafer with the laser beam through the protective film to form grooves on the surface of the wafer along the scribe streets.

21. The processing method according to claim 18, further comprising removing the protective film from the surface of the wafer, including the circuit devices, by washing with water after irradiation with the laser beam.

* * * * *